(12) United States Patent
Suyama et al.

(10) Patent No.: US 6,583,558 B1
(45) Date of Patent: Jun. 24, 2003

(54) ELECTRON TUBE

(75) Inventors: Motohiro Suyama, Hamamatsu (JP); Akihiro Kageyama, Hamamatsu (JP); Masaharu Muramatsu, Hamamatsu (JP)

(73) Assignee: Hamamatsu Photonics K. K., Hamamatsu (JP)

( * ) Notice: Subject to any disclaimer, the term of this patent is extended or adjusted under 35 U.S.C. 154(b) by 0 days.

(21) Appl. No.: 09/868,883

(22) PCT Filed: Jan. 21, 1999

(86) PCT No.: PCT/JP99/00213
§ 371 (c)(1),
(2), (4) Date: Jun. 22, 2001

(87) PCT Pub. No.: WO00/44027
PCT Pub. Date: Jul. 27, 2000

(30) Foreign Application Priority Data

Jul. 24, 1997 (JP) .............................. 9-198867

(51) Int. Cl.[7] .................. H01J 40/06; H01J 40/14; H04N 3/14; H04N 5/225; H04N 5/335
(52) U.S. Cl. ............... 313/542; 313/543; 313/544; 348/294; 348/311; 348/315; 348/216; 348/217; 250/207; 250/214 VT; 250/208.1; 250/214.1
(58) Field of Search ............. 250/207, 214 VT, 250/208.1, 214.1; 348/294, 311, 315, 216, 217; 313/542, 543, 544

(56) References Cited

U.S. PATENT DOCUMENTS 4,682,021 A * 7/1987 Fitts ..................... 250/214 VT
6,124,179 A * 9/2000 Adamic, Jr. ................. 438/309

FOREIGN PATENT DOCUMENTS

| JP | B2 6-66922 | 8/1994 |
| JP | A 7-169928 | 7/1995 |
| JP | B2-2821062 | 8/1998 |
| JP | A 11-40087 | 2/1999 |

* cited by examiner

Primary Examiner—Nimeshkumar D. Patel
Assistant Examiner—Anthony T. Perry
(74) Attorney, Agent, or Firm—Oliff & Berridge, PLC

(57) ABSTRACT

An electron tube 10 mainly includes a sleeve 12, an input plate 14 having a photocathode surface 18, a stem 16 and a CCD 20. A vacuum is provided in an interior of the electron tube 10. The CCD 20 is fixed onto the stem such that a rear surface B faces the photocathode surface 18. In the CCD 20, on a single conductive type semiconductor substrate 64, a buried layer 66, a barrier region 68, a $SiO_2$ layer 70, a storage electrode layer 72, a transmission electrode layer 74, and a barrier electrode layer 76 are formed at their predetermined positions. A PSG film 78 is formed at an entire front surface A over these layers to flatten the surface of the CCD 20. Further, SiN film 106 mainly composed of SiN is formed above the PSG film over the entire front surface A.

7 Claims, 9 Drawing Sheets

ELECTRON TUBE

TECHNICAL FIELD

The present invention relates to a highly sensitive electron tube for quantitatively measuring an extremely weak light.

BACKGROUND ART

For measuring an extremely weak light, conventionally known is an electron tube as a light detector in which a charge coupled device (CCD) is used as an anode. Particularly in an electron tube described in Japanese Patent Publication No. Hei-7-95434, electron emitted from a photocathode in response to an incidence of light is directed into a rear side of a device formation surface to detect a signal. Such electron tube is widely used because of high sensitivity and high imaging quality.

An electron tube using a rear side irradiation type CCD generally includes a sleeve having two openings, an input plate provided with a photo-cathode adapted for emitting electron corresponding to the incident light, and a stem provided with the CCD. The input plate and the stem are adhered to the sleeve to plug the openings, and a vacuum is provided in an interior defined by the sleeve, the input plate and the stem. Further, the CCD is fixed to the stem in such a manner that the rear surface of the CCD is in confrontation with the input plate, and the entire CCD is positioned in the interior of the electron tube. At a front side of the rear irradiation type CCD, there are provided, on a semiconductor substrate, a $SiO_2$ layer, charge storage electrode layer and a charge transmission electrode layer. The charge incident on the rear surface of the CCD is capable of being accumulated and transferred.

Here, since the photocathode can be formed only in a vacuum condition, in a process for making the electron tube, alkali metal such as Na, K and Cs is introduced into an interior of the electron tube in a vacuum condition, and the metal is acted on the input plate to form the photocathode. However if the alkali metal may be entered into the charge transmission portion on the substrate of the CCD which is a semiconductor element, and if the alkali metal reaches a gate $SiO_2$ film, fixed charge and interface state may be increased, and therefore, the CCD characteristic is extremely degraded.

In order to eliminate the above-described problem, the present inventors have investigated the following methods. That is, a glass is bonded to the surface of the CCD by anodic bonding to protect the CCD against the alkali metal. However, due to the significant difference in thermal expansion coefficient between the glass and silicon which is the basic material of the CCD, high stress is imparted on the CCD in a subsequent high temperature process, and as a result, the CCD is damaged.

In an alternative method, the surface of the CCD is covered with a resin to protect the CCD against the alkali metal. However, the resin cannot withstand the subsequent high temperature process, and a gas is generated from the resin to degrade vacuum condition in an interior of the electron tube.

Further, a vacuum is normally provided in an inside of the electron tube, and insulation material in the electron tube is easily chargeable because of the application of high negative voltage to the photocathode for operation. Therefore, highly insulative $SiO_2$ layer at the surface of the CCD and the insulation material in the tube are extremely strongly charged. Here, the electron tube employing rear surface irradiation type CCD is adapted for detecting extremely weak signal such as a charge of about several tens of electrons, and therefore, the charging on the surface of CCD and on the ambient insulation material may become a large noise source to excessively lower the detection accuracy.

In view of the above-described problems, it is an object of the present invention to provide a highly sensitive electron tube capable of avoiding degradation of CCD characteristic due to the internally introduced alkali metal with preventing the CCD from being subjected to excessive thermal stress during manufacture of the electron tube, and avoiding gas discharge and capable of moderating charging on the surface of the semiconductor element and its ambient components.

DISCLOSURE OF INVENTION

These objects of the present invention will be attained by an electron tube including a vacuum container, a cathode sealed in the vacuum container and having a photocathode surface containing an alkali metal, and an anode sealed in the vacuum container and having a rear side irradiation type semiconductor device formed with a charge transmission portion, the anode having a rear surface side in confrontation with the photocathode surface. The rear side irradiation type semiconductor device includes a flattened film, an electrically conductive lead, and a thin film. The flattened film covers the charge transmission portion and has a flattened top surface. The lead is formed on the flattened film and is electrically connected to the charge transmission portion. The thin film is formed over the flattened film and the lead, and is mainly composed of a silicon nitride.

As a result of the formation of the device, the front surface side of the rear side irradiation type semiconductor device becomes irregular, which involves high stress. By forming the flattened film over the device forming portion such as the charge transmission portion at the front surface side, the front surface becomes flattened, to protect the semiconductor device from application of excessive stress. Further, by the flattened surface at the front surface side of the semiconductor device, an electrical lead and a thin film mainly composed of silicon nitride can be easily formed.

Further, the thin film mainly composed of silicon nitride and formed over the flattened film and the lead can prevent alkali metal from being entered into the semiconductor device, the alkali metal being used for activating the photocathode surface. Thus, degradation of characteristic of the semiconductor device can be avoided. By the formation of the silicon nitride film over the uppermost surface of the semiconductor device serving as an anode, the alkali metal introduced into the tube cannot be entered into the semiconductor device. Consequently, high sensitivity can be obtained.

Furthermore, the flattened film formed below the silicon nitride film can avoid peeling of the silicon nitride film, and can moderate stress at the boundary therebetween.

Preferably, a $SiO_2$ layer is formed over the surface of the charge transmission portion. The flattened film is made from a phosphosilicate glass and is formed between the $SiO_2$ layer and the thin film.

By providing the flattened film made from phosphosilicate glass between the thin film mainly composed of silicon nitride and the $SiO_2$ layer forming the surface of the semiconductor device, any stress due to the difference in thermal expansion coefficient among the conductive lead, the thin film mainly composed of silicon nitride and the $SiO_2$ layer can be moderated. Further, by forming, over the topmost surface of the semiconductor device, the thin film mainly composed of silicon nitride having an electrical conductivity higher than SiO$_2$, charging to the surface of the semiconductor device and its ambient portion can be moderated. As a result, any affect due to unwanted electrical charge imparted on the semiconductor device can be moderated, and highly sensitive device can be obtained.

Preferably, the charge transmission portion has a terminal portion, and a through hole is formed in the flattened film at a position above the terminal portion. The lead is electrically connected to the terminal portion through the through hole. With this arrangement, signal at the charge transmission portion can be easily transmitted to the lead.

Further, preferably, the lead has a bonding pad, and a through hole is formed in the thin film at a position above the bonding pad so as to expose the bonding pad, and an electrically conductive member is arranged in the through hole for connection to the bonding pad. With this arrangement, signal transmission between an external device and the lead can be easily performed.

BEST MODE FOR CARRYING OUT THE INVENTION

Figure 1:
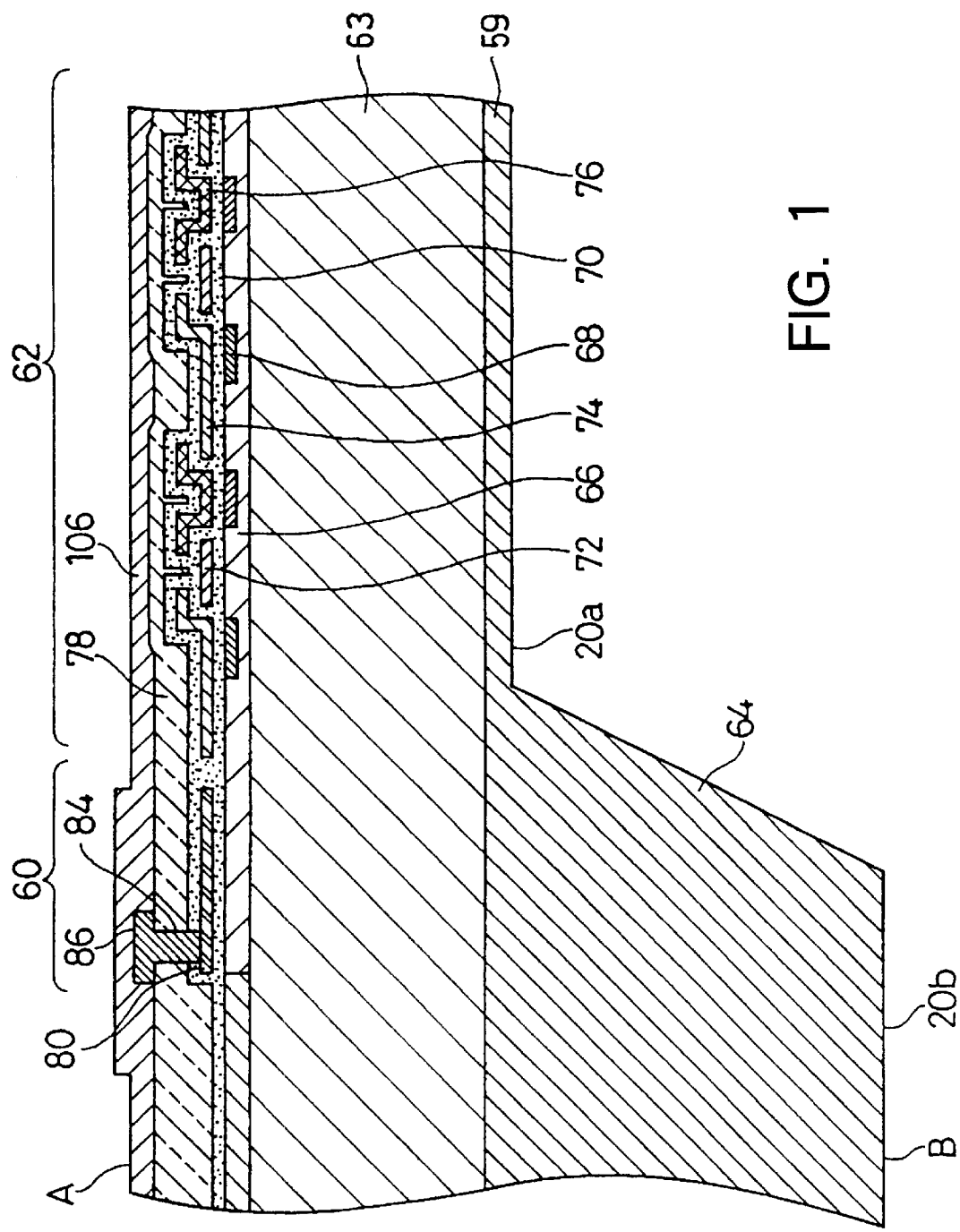
FIG. 1 is a cross-sectional view showing a CCD used in an electron tube according to an embodiment of the present invention.

An electron tube according to one embodiment of the present invention will be described with reference to FIGS. 1 through 7. FIG. 2 shows a cross-section of the electron tube according to the embodiment. The electron tube 10 includes a sleeve 12 having two open ends. A generally disc shaped input plate 14 is bonded to one open end and a generally disc shaped stem 16 is bonded to the other open end, to provide a sealed structure in which a vacuum space is provided in an interior. A photocathode 18 is formed at a vacuum side surface of the input plate 14, and a CCD 20, which is a semiconductor device, is fixed to a vacuum side surface of the stem 16, to thus function as the electron tube.

The sleeve 12 includes a cylindrical upper tube 22, a cylindrical lower tube 24 and an annular disc shaped flange 26. These upper and lower tubes 22 and 24 have outer diameter of 43 mm and are formed of a ceramic material. The annular disc shaped flange 26 is interposed between the upper and lower tubes 22 and 24 and has an outer diameter approximately equal to that of the upper and lower rubes and is formed of a metal. These are integral with each other by brazing. The upper tube 22 has an opening 12a (hereinafter simply referred to as "first opening 12a") provided with an annular disc shaped upper electrode 28. The lower tube 24 has an opening 12b (hereinafter simply referred to as "second opening 12b") provided with an annular disc shaped lower electrode 30. These electrodes are adapted for supplying a bias voltage to the photocathode 18. The upper electrode 28 is in a gutter shape so as to inject an indium (In) 32 therein to, the indium serving as an adhesive agent for bonding the sleeve 12 to the input plate 14 and as a hermetic member for creating the vacuum space. Further a getter 34 is electrically connected between the flange 26 and the lower electrode 30 for absorbing therein a residual gas in the tube.

As shown in FIG. 2, the input plate 14 mainly includes a disc shaped plate 36 formed of a Koval glass. The disc shaped plate 36 has a major surface area having a protruded portion at its center. A photocathode surface 18 formed of an alkali metal is formed over the protruded surface. Further, a thin metallic film 38 formed of Cr is formed in a region from a contour of the photocathode surface 18 toward an outer peripheral end of the disc shaped plate 36. The input plate 14 is fixed to the first opening 12a of the sleeve 12 in such a manner that the protruded portion is positioned inside of the sleeve 12. The radially outer portion of the surface area of the disc shaped plate 36 is bonded to and sealed with the upper electrode 28 of the sleeve 12 by the "In" material 32 injected into the gutter shaped upper electrode 28. Further, the photocathode surface 18 and the upper electrode 28 is electrically connected to each other by the metallic thin film 38 formed over the disc shaped plate 36, so that high voltage can be applied to the photocathode surface 18.

As shown in FIG. 2, the stem 16 includes a thickened base stack plate 40 including four disc shaped ceramic plates 40a through 40d. The base stack plate 40 has a peripheral surface fixed with a metallic annular flange 42 by brazing. The flange 42 is in electrical contact with the sleeve 12 and forms the vacuum space in the tube. A base substrate 44 formed of a silicon is bonded to an upper portion of an uppermost ceramic plate 40a by an adhesive agent 43 (FIG. 3) for fixing the CCD 20 to the base substrate. The lowermost ceramic plate 40d is provided with a plurality of stem pins 46 for transmitting an output signal from the CCD 20. An internal wiring or lead (not shown) is provided in the base stack plate 40 for transmitting the output signal from the CCD 20 to the stem pins 46. These internal wiring are provided for each ceramic plate such that a wire pitch is gradually altered with respect to neighboring ceramic plates in order to provide a proper electrical connection between the neighboring ceramic plates and to the stem pins 46. The stem 16 is fixed to the second opening 12b of the sleeve 12 such that the base substrate 44 is positioned inside of the sleeve 12. The metallic flange 42 and the lower electrode 30 of the sleeve 12 are welded for bonding and sealing together.

The CCD 20 is a semiconductor device (see FIG. 1) in which device layers such as a storage electrode layer and a transmission electrode layer are formed on a silicon substrate. As shown in FIG. 2, the CCD 20 is fixed onto the base substrate 44 such that the device forming surface (hereinafter simply referred to as a "front surface A") faces the base substrate 44, and an opposite surface (hereinafter simply referred to as a "rear surface B") faces the photocathode surface 18. The CCD 20 has a center portion 20a to which electron is directed. A part of the silicon substrate is cut away from the rear surface B to provide the center portion 20a whose thickness is smaller than an ambient area 20b. Incidentally, in FIG. 2, the reference numeral 50 designates an insulative filler, 52 designates a groove formed in the base substrate 44, 54 designates a lead connecting the base substrate 44 to the base stack plate 40, and 56 designates a shielding electrode, those will be described detail with reference to FIG. 3(a).

FIG. 3(a) shows a cross-section of a bonding portion between the CCD 20 and the base substrate 44. At the radially outer portion 20b of the surface A of the CCD 20, a plurality of bumps 47 mainly composed of Au are provided along with a bonding pad 48 formed of aluminum. At an upper surface of the base substrate 44, a bonding pad 49 is provided by Au deposition at a position corresponding to the bonding position to the bump 47. The CCD 20 and the base substrate 44 are mechanically and electrically connected to each other by the bonding pads 48, 49 and the bump 47. Because the base substrate 44 and the base substrate of the CCD 20 are formed of silicon, thermal stress does not occur during baking process in the production. On the other hand, bonding strength of the bump 47 is lowered in accordance with increase in temperature. To avoid this, insulative filler 50 such as insulative resin is injected around the bonding portion of the bump 47, thereby maintaining stable connection between the CCD 20 and the base substrate 44.

The grooves 52 are formed on the base substrate 44 at radially inner side of the bonding portion of the bump 47. Surplus insulative filler 50 can be flowed into the grooves 52 or can be stopped at an edge of the grooves because of surface tension during injection of the insulative filler 50. Thus, the grooves 52 can prevent the insulative filler 50 from being adhered onto the surface of the center portion 20a of the CCD 20.

Figure 4:
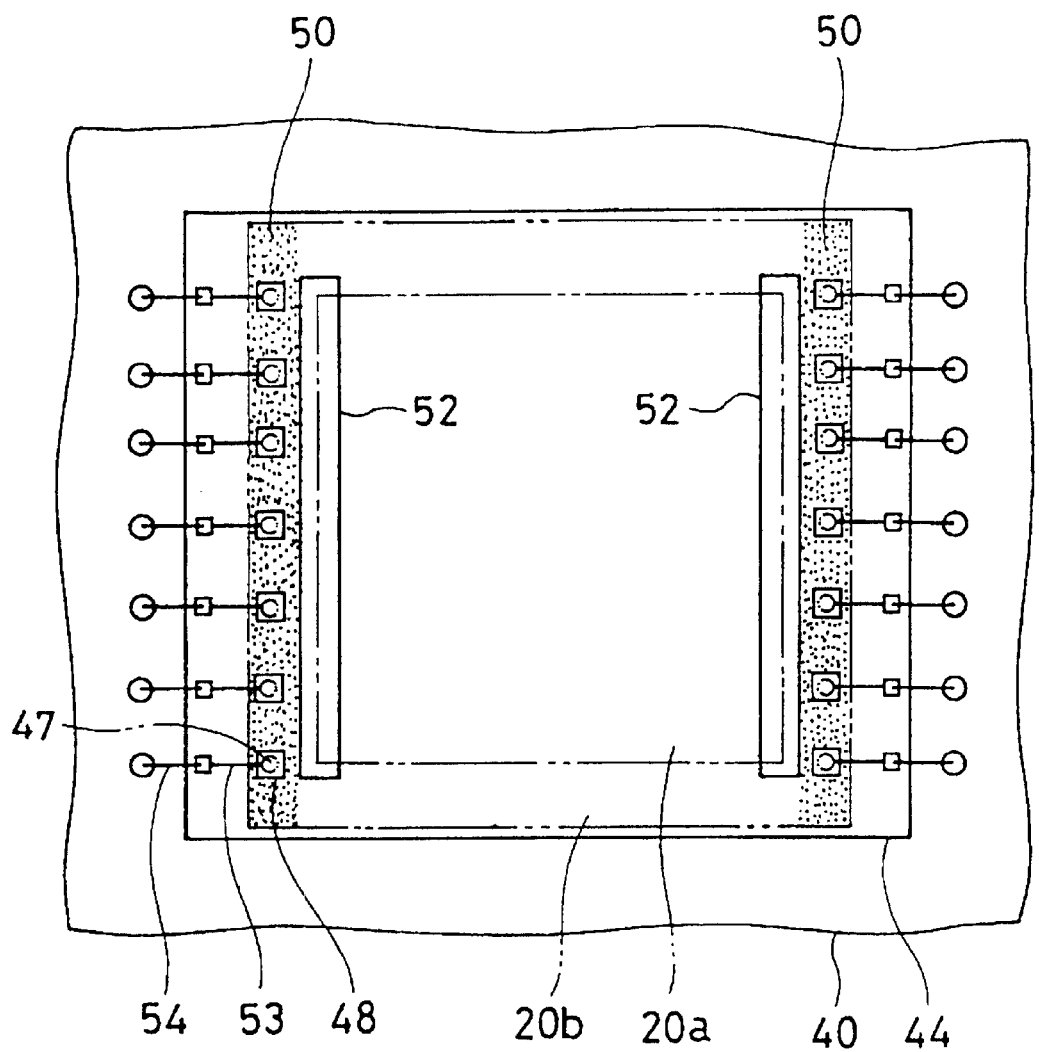
FIG. 4 is a plan view showing the bonding portion of the CCD in the electron tube according to the embodiment of the present invention.

FIG. 4 shows a plan view of bonding portion between the CCD 20 and the base substrate 44. Electrical connection from the bump 47 to the stem pin 46 is established by aluminum lead 53 formed on the base substrate 44, a lead 54 connecting the base substrate 44 to the base stack plate 40, and the internal wiring provided in the base stack plate 40. The shielding electrode 56 is attached to the stem 16 by resistance welding. An upper portion of the lead 54 is positioned immediately below the shielding electrode 56 in order to improve withstand voltage between the CCD 20 and the photocathode surface 18 imparted with high voltage.

Figure 5:
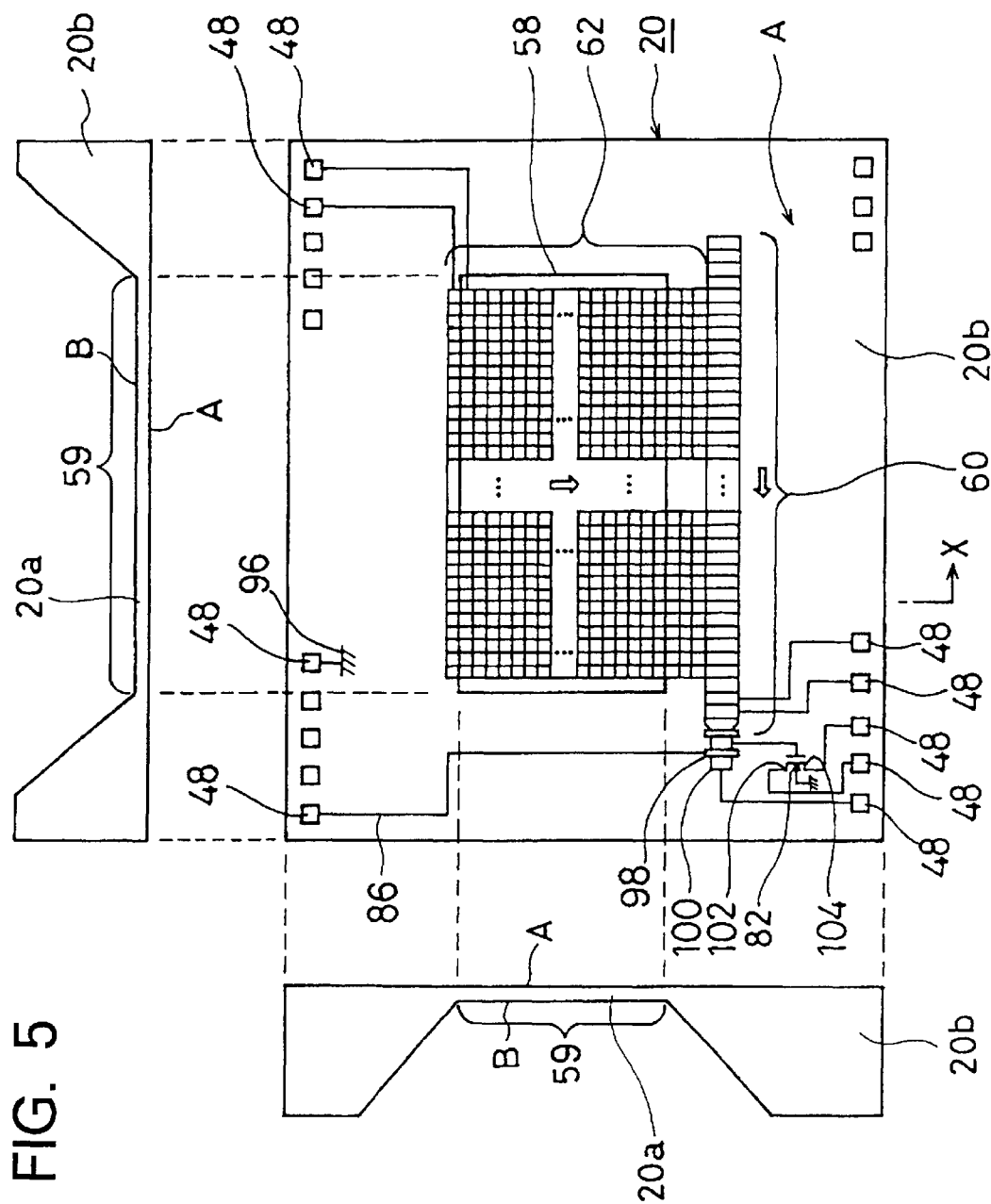
FIG. 5 is a plan view and a side view showing the CCD used in the electron tube according to the embodiment of the present invention.

As shown in FIG. 5, the center portion 20a is extremely thinner than the ambient portion 20b surrounding the center portion. The rear surface B side of the center portion 20b serves as an electron incident portion 59. The front surface A side of the center portion 20b includes a horizontal charge transmission portion 60 and a vertical charge transmission portion 62 for reading the charge incident on the electron incident portion 59 and transmitting the charge to an external circuit. Incidentally, in FIG. 5, the reference numeral 82 designates an FET portion, 86 designates an electrically conductive aluminum lead, 96 designates a substrate plate connecting portion, 98 designates a reset gate terminal, 100 designates a reset drain terminal, 102 designates an output drain terminal, and 104 designates an output source terminal. These are known in the semiconductor device, and further explanation will be omitted.

Figure 2:
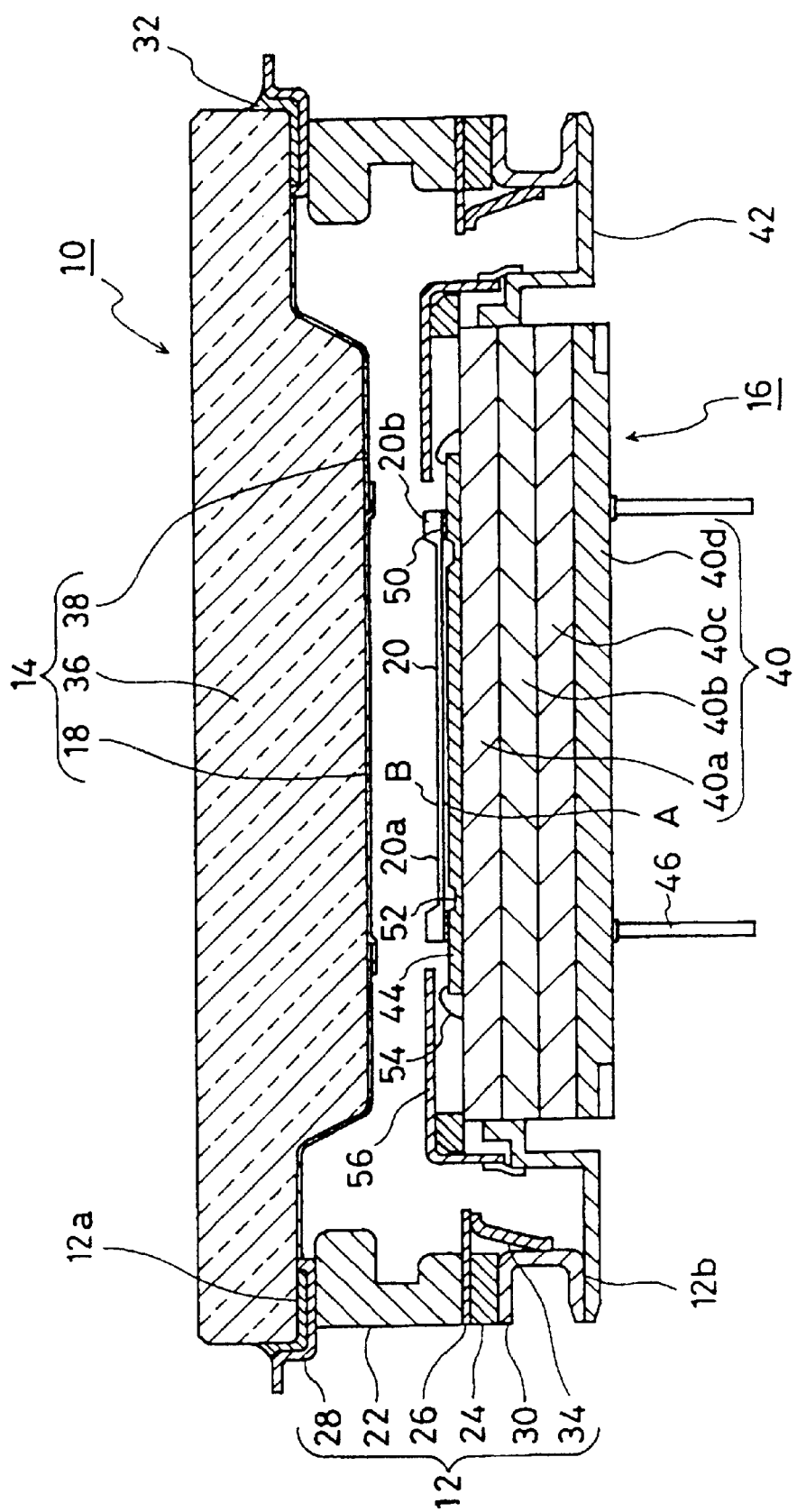
FIG. 2 is a cross-sectional view showing the electron tube according to the embodiment of the present invention.
Figure 3:
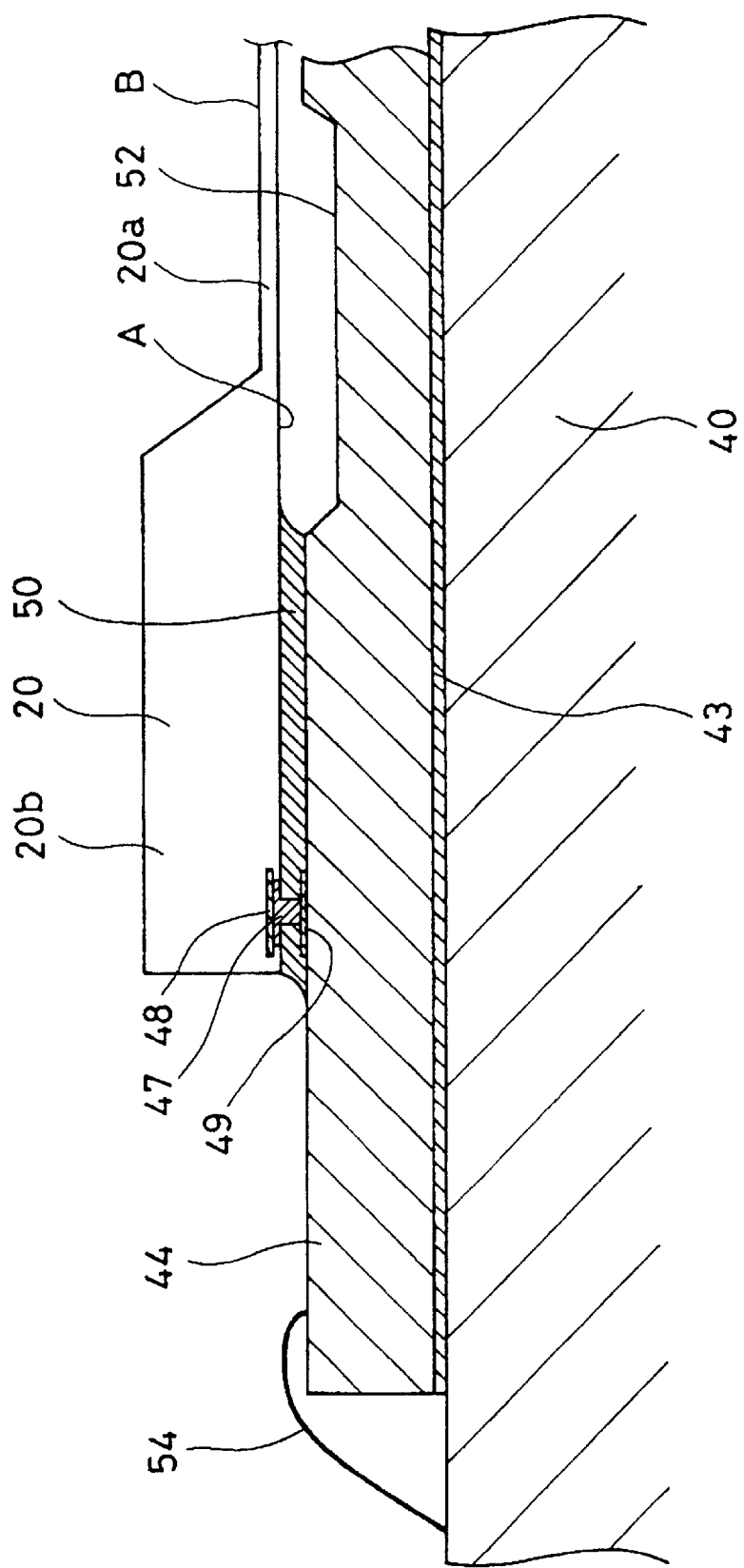
FIG. 3(a) is a cross-sectional view showing a bonding portion of the CCD in the electron tube according to the embodiment of the present invention.
FIG. 3(b) is a cross-sectional view showing a conductive lead terminal portion and a through hole of a thin film in the electron tube according to the embodiment of the present invention.
Figure 3:
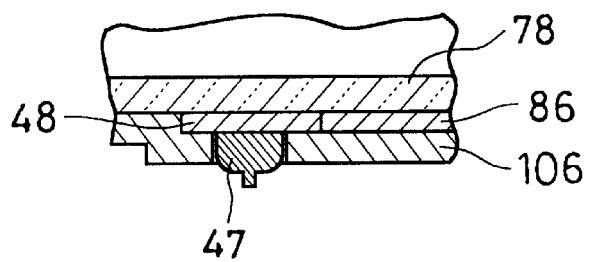

FIG. 1 shows the cross-section taken along the line X—X of FIG. 5. The CCD 20 is formed on the semiconductor substrate 64. The semiconductor substrate 64 is formed of P-type or N-type silicon. An epitaxial layer 63 whose density of impurities is different from that of the semiconductor substrate 64 is formed on the front surface side of the semiconductor substrate 64. The CCD 20 is formed at the side of the epitaxial layer 63. The semiconductor substrate 64 has a central portion thinner than a surrounding portion. A buried layer 66, which is the different conduction type against the semiconductor substrate 64, is formed on the semiconductor substrate 64. Barrier regions 68 are formed in the predetermined positions of the buried layer 66 by incorporating impurities therein to. Thus, the density of impurity in the barrier layer 66 is different from that of the remaining portion of the buried layer 66. On the buried layer 66, a storage electrode layer 72, a transmission electrode layer 74 and a barrier electrode layer 76 are formed in a predetermined stacking fashion with interposing $SiO_2$ layer 70 between the layers.

A PSG film (flattened film) made from phosphosilicate glass (hereinafter simply referred to as "PSG") is formed over the entire front surface A side of the CCD 20, so that the surface of the CCD 20 is flattened. A contact hole 84 is formed in the PSG film 78 at a portion above terminals such as electrodes 80 of the vertical charge transmission portion 62 and the horizontal charge transmission portion 80 and terminals of the FET 82, etc. These terminals are electrically connected to the electrically conductive aluminum lead 86 formed on the PSG film 78 through the contact hole 84. To be more specific with reference to FIG. 1, the PSG film 78 is formed with a through hole serving as the contact hole 84 at a position above the electrode 80 which serves as a terminal of the charge transmission portion. Thus, the electrically conductive aluminum lead 86 is electrically connected to the terminal through the conductive material in the through hole. A SiN film (thin film) 106 is formed on the upper surface of the PSG film 78 as described later in detail.

Figure 6:
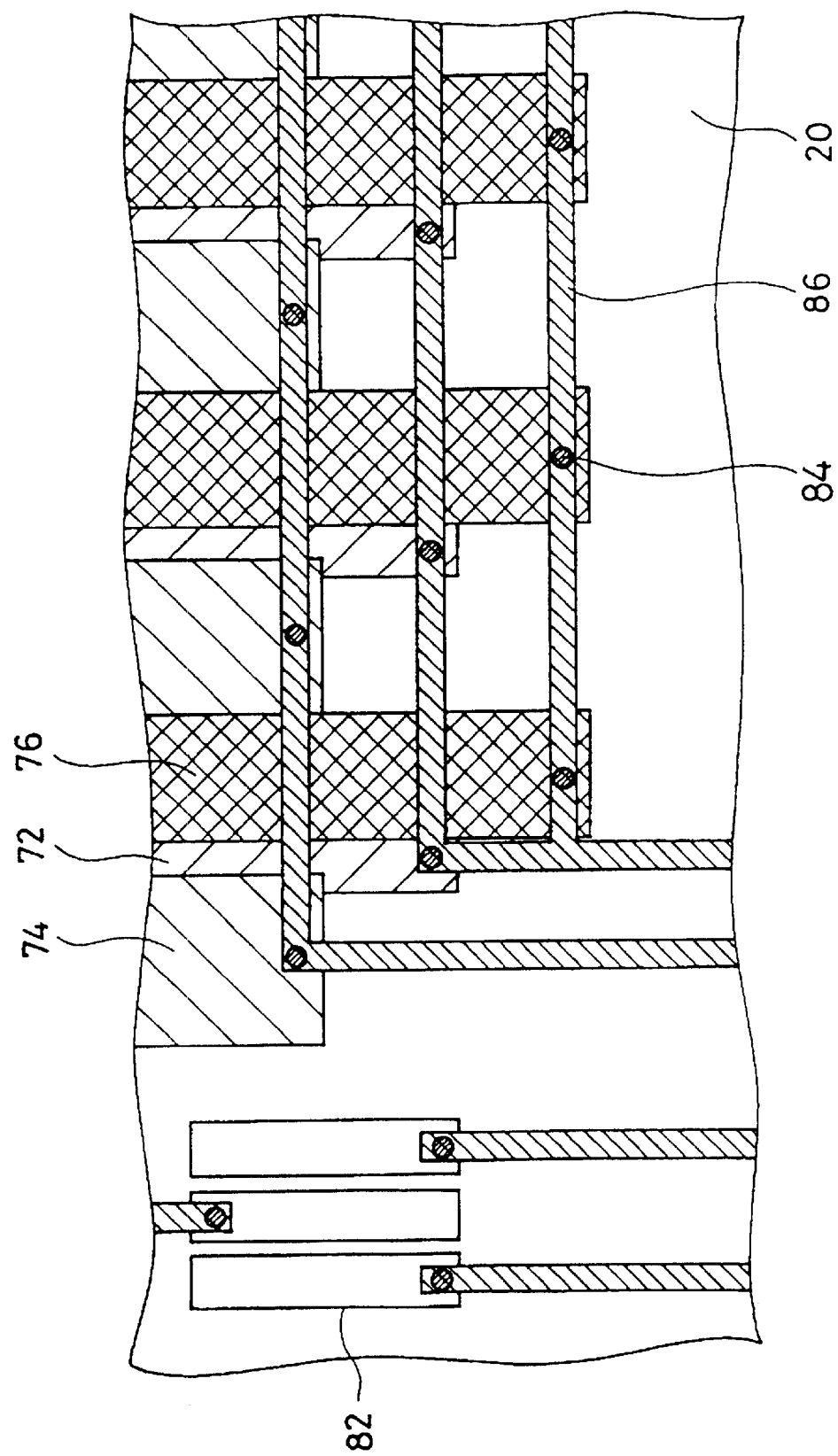
FIG. 6 is an enlarged view showing the CCD used in the electron tube according to the embodiment of the present invention.

FIG. 6 is a schematic illustration showing the aluminum lead 86 and the contact hole 84 at the horizontal charge transmission portion. The aluminum lead 86 is provided to overlap with the contact hole 84, so that the terminal of the charge transmission portion and the aluminum lead 86 can be electrically connected. The terminal mentioned herein is the connecting portion of the part of the horizontal charge transmission portion 60 and the vertical charge transmission portion 62 to the aluminum lead passing through a contact hole 84.

Figure 7:
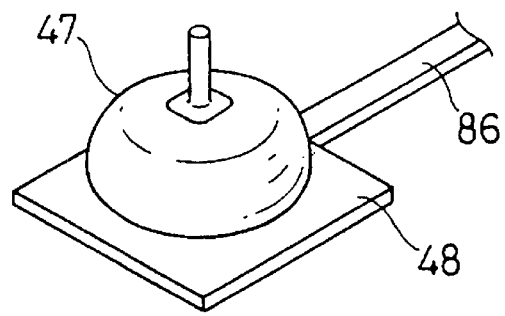
FIG. 7 is a perspective view showing a bonding pad used in the electron tube according to the embodiment of the present invention.

The aluminum lead 86 formed on the PSG film 78 provides electrical connection to the horizontal charge transmission portion 60, the vertical charge transmission portion 62, the substrate plate connecting portion 96, the reset gate terminal 98, the reset drain terminal 100, the output drain terminal 102, and the output source terminal 104, etc. Further, at a connection terminal portion between the base substrate 44 and the CCD 20, a bonding pad 48 having an area larger than the aluminum lead 86 is provided as shown in FIG. 7, and a protruded bump 47 made from Au is provided on the bonding pad 48.

The SiN film 106 is mainly composed of SiN, and is formed over an entire front surface A, i.e., formed over the PSG film 78 and the aluminum lead 86. The SiN film 106 formed above the various terminal portion is partly removed to provide electrical connection between the CCD 20 and the base substrate 44, so that the bonding pad 48 is exposed to function as an electrode. To be more specific, as shown in FIG. 3(b), a through hole is formed in the SiN film 106 at a position above the bonding pad 48 serving as a terminal of the electrically conductive aluminum lead 86. In the through hole, the bonding pad 48 is exposed, and in the through hole the bump 47 is disposed in contact with the bonding pad 48.

Next, a method for producing the electron tube 10 according to the embodiment will be described. First, the CCD 20 is produced. FIGS. 8 through 13 show various process for producing the CCD 20. These figures are schematic and do not show accurate dimension.

Figure 8:
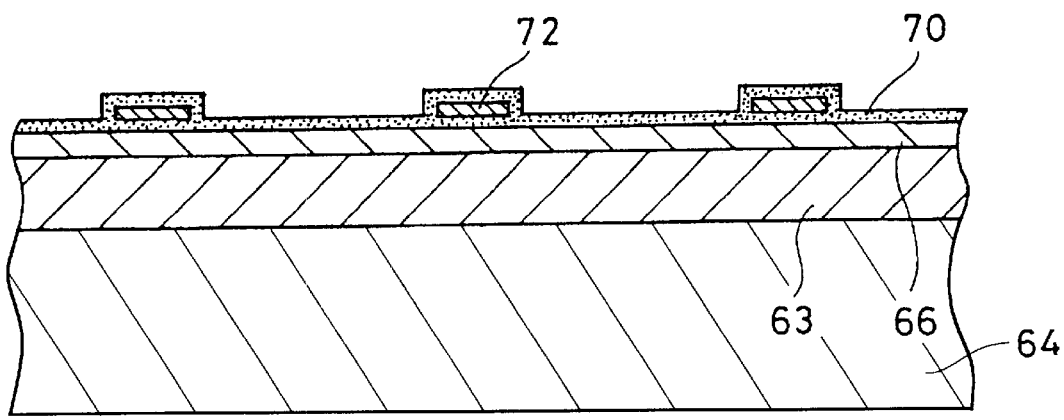
FIG. 8 is a cross-sectional view showing a first process for producing the CCD used in the electron tube according to the embodiment of the present invention.

In a first process shown in FIG. 8, is prepared a semiconductor substrate 64 made from one of P-type and N-type single conductive type semiconductor silicon. The semiconductor substrate has an upper surface side formed with an epitaxial layer 63 whose density of impurities is different from that of the remaining portion. A buried layer 66 is formed on the epitaxial layer. The buried layer is a different conduction type against the semiconductor substrate 64. Then, a $SiO_2$ layer 70 is formed over the surface of the buried layer 66. Further, a storage electrode layer 72 made from a polycrystalline silicon is formed on the $SiO_2$ layer 70, and then, $SiO_2$ layer 70 is again formed over the storage electrode layer 72.

Figure 9:
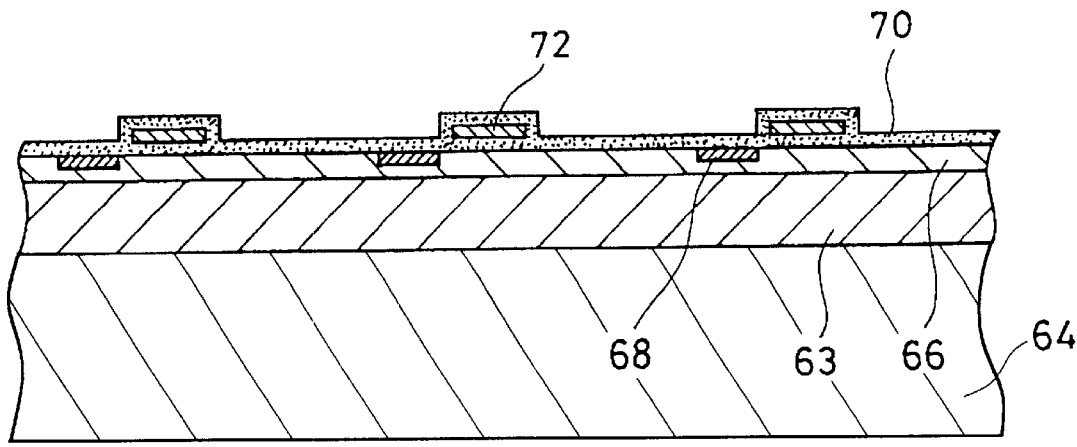
FIG. 9 is a cross-sectional view showing a second process for producing the CCD used in the electron tube according to the embodiment of the present invention.

In a second process shown in FIG. 9, impurities are implanted to one side of the buried layer 66, the one side being facing the storage electrode layer 72, by ion implantation using a photoresist in order to form barrier regions 68 whose density of impurities is different from that of the buried layer 66.

Figure 10:
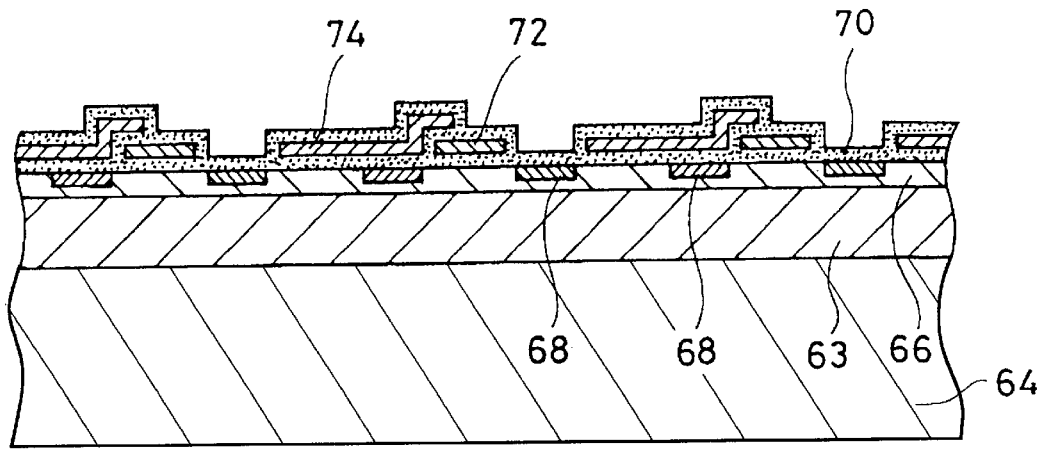
FIG. 10 is a cross-sectional view showing a third process for producing the CCD used in the electron tube according to the embodiment of the present invention.

In a third process shown in FIG. 10, a transmission electrode layer 74 is formed over the barrier regions 68 such that one end of the layer 74 is overlapped with the storage electrode layer 72 and other end of the layer 72 is not overlapped with the storage electrode layer 72 but is spaced away therefrom. Then, $SiO_2$ layer 70 is again formed over the transmission electrode layer 74. Further, impurities are implanted into the buried layer 66 at a spacing position between the storage electrode layer 72 and the transmission electrode layer 74 by ion implantation in order to form additional barrier regions 68 whose density of impurities is different from that of the buried layer 66.

Figure 11:
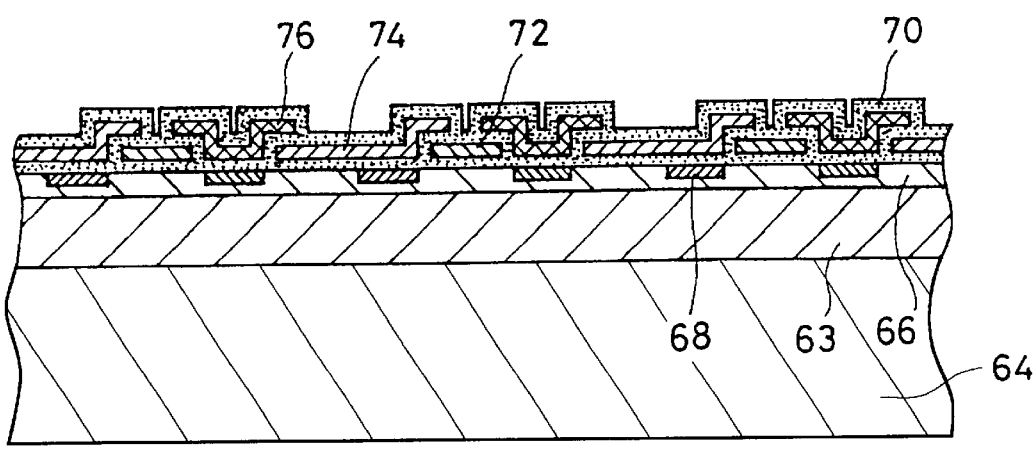
FIG. 11 is a cross-sectional view showing a fourth process for producing the CCD used in the electron tube according to the embodiment of the present invention.

In a fourth process shown in FIG. 11, a barrier electrode layer 76 made from polycrystalline silicon is formed over the barrier regions 68 formed in the third process such that the barrier electrode layer 76 is partly overlapped with neighboring storage electrode layer 72 and the transmission electrode layer 74. Then, $Sio_2$ layer 70 is formed over the barrier electrode layer 76.

Figure 12:
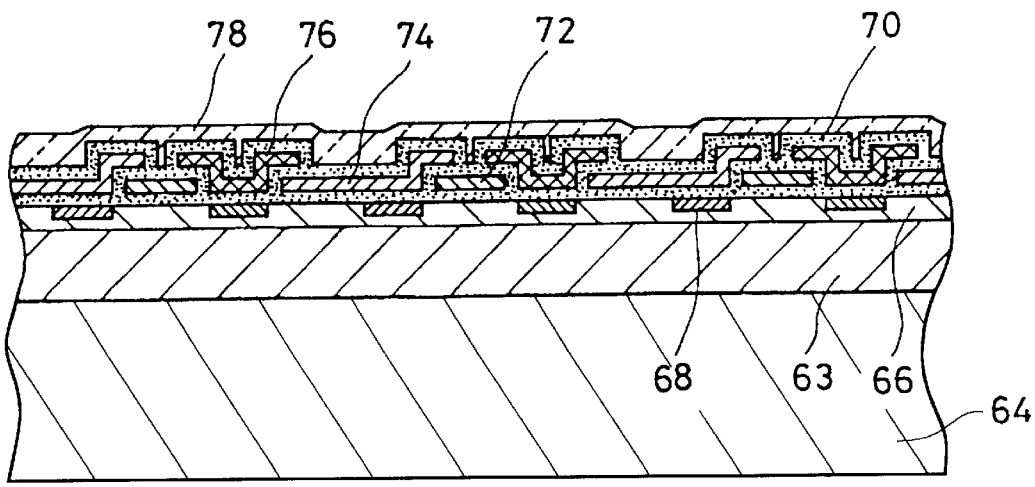
FIG. 12 is a cross-sectional view showing a fifth process for producing the CCD used in the electron tube according to the embodiment of the present invention.

In a fifth process shown in FIG. 12, PSG film 78 are formed over an entire surface of the CCD 20 in order to flatten the CCD surface. Then, PSG is re-flowed (heated and melted) to smoothen the surface to obtain a flattened surface of the PSG film 78. Further, the aluminum lead 86 is arranged on the surface of the PSG film 78, and contact holes 84 are formed in the PSG film 78 at positions above the terminal portions such as electrodes 80 of the horizontal charge transmission portion 60 and the vertical charge transmission portion 62 and the terminal of FET 82, etc. Thus, the storage electrode layer 72, the transmission electrode layer 74 and the barrier electrode layer 76, etc. are electrically connected to the aluminum lead 86. Moreover, bonding pads 48 are formed at each terminal portion for connecting to the external circuit.

Figure 13:
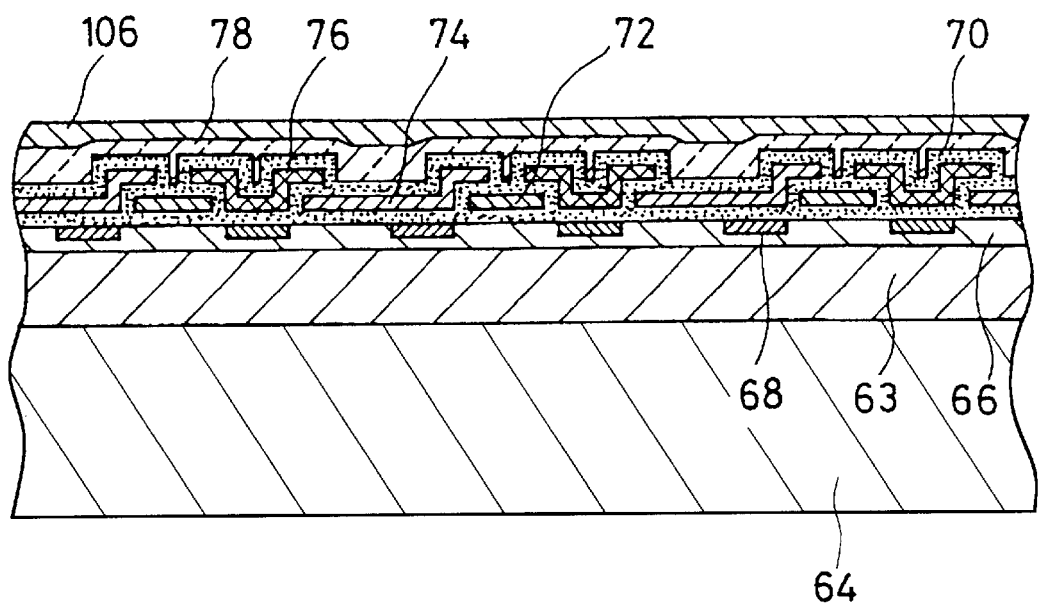
FIG. 13 is a cross-sectional view showing a sixth process for producing the CCD used in the electron tube according to the embodiment of the present invention.

In a sixth process shown in FIG. 13, the SiN film 106 is formed by CVD method over the entire surface of the CCD 20, i.e., over the PSG film 78. Then, the SiN film is partly removed at positions corresponding to the terminal portions to expose the bonding pads 48 thereby forming the electrodes.

In a seventh process (not shown), the radially outer surface portion 20b of the rear surface B of the CCD 20 is covered with a SiN mask, and a chemical etching is performed. As a result, thickness of the radially inner portion of the CCD 20 is reduced to 20 μm, to provide the center portion 20a, i.e., the electron incidence portion 59. KOH solution, a solution of mixture of hydrogen fluoride, nitric acid and acetic acid. Then, impurities are doped into the electron incidence portion 59 at the rear surface B by ion implantation to form an accumulation layer. Therefore, any charged signal created at or around the boundary of the rear surface B can be easily flowed into a potential well of the CCD 20.

The thus produced CCD 20 is bonded to the base substrate 44. That is, the bump 47 on the bonding pad 48 formed at the radially outer surface portion 20b of the CCD 20 is thermally pressed onto the bonding pad 49 formed on the base substrate 44 at the temperature of about 300° C. In this case, in the base substrate 44, are already formed the grooves 52 and the aluminum lead 53 which provides electrical connection between the bonding pad 49 and the wire 54. The grooves 52 are formed by etching with KOH solution.

Then, insulative filler 50 is injected to the bonding portion and the filler is cured. In this case, when the insulative filler 50 is injected from the opposing two sides of the groove 52, the insulative filler 50 can be desirably filled into the space between the CCD 20 and the base substrate 44 because of the capillary action. Further, because the groove 52 is formed, a confined air space is not provided. Therefore, any damage to the CCD 20 due to the expansion of an confined air can be avoided. Moreover, excess insulative filler 50 can be flowed into the groove 52, or can be stopped at the edge of the groove 52 because of the surface tension. Accordingly, the insulative filler 50 does not adhere to the center portion 20 at the front surface of the CCD 20. Consequently, any deformation of the center portion 20a of the CCD 20 can be obviated during curing phase of the insulative filler 50.

After the CCD 20 and the base substrate 44 are mechanically connected to each other, the base substrate 44 and the base stack plate 40 are bonded to each other by an adhesive agent 43, and the aluminum lead 53 on the base substrate 44 and the base stack plate 40 are electrically connected to each other by the wire 54. Thereafter, the shielding electrode 56 is welded to the base stack plate 40 by the resistance welding.

Next, the input plate 14 formed with thin Cr deposition layer at a vacuum side and an assembly of the sleeve 12 and the stem 16 connected thereto by the flange etc. are set in a transfer device, and baking is performed at the temperature of about 300° C. in the transfer device after evacuation thereof.

After baking, K, Cs and Na are applied to the inputplate 14 to form the photocathode surface 18. Alternatively, activation of semiconductor crystal of IIIB–VB family such as GaAs and GaAsP previously bonded to the input plate 14 can form the photocathode surface 18 by applying Cs and $O_2$ to the surface. Stable production of the electron tube 10 is achievable, since the SiN film 106 formed over the surface of the CCD 20 does not release gas in the vacuum condition even heated at the temperature of about 300° C.

The input plate 14 is hermetically connected to the sleeve 12 with In material 32 to thus provide the resultant electron tube 10. In this case, a gap between the photocathode surface 18 and the CCD 20 is approximately 2 mm. After fabrication of the electron tube 10, voltage is applied to the flange 26 to activate the getter 34 in order to absorb therein the residual gas in the tube.

Next, function and effect of the electron tube according to the present embodiment will be described. The photocathode 18 of the electron tube 10 is applied with high voltage such as −8 kV, and electron incidence portion 59 of the CCD 20 is grounded. Accordingly, the electron emitted to the vacuum region of the electron tube 10 from the photocathode 18 is accelerated by an electric field, and is impinged onto the electron incidence portion 59 of the CCD 20 in accordance with the optical intensity incident into the photocathode 18. The accelerated electron generates a multiple numbers of pairs of electron/hole, when energy is lost in the silicon semiconductor substrate 64. If the applied voltage is −8 kV, about 2000 times as large as gain can be obtained. The multiplied electron is read to provide an image pickup.

Here, in case of a conventional electron tube, alkali metal such as Na, K, Cs, etc. is introduced into the tube for forming the photocathode surface, and therefore, the CCD 20 is also exposed to the alkali metal. As a result, the alkali metal may be invaded into the charge transmission portion on the substrate of CCD. If the alkali metal reaches the gate $SiO_2$ film, fixed charge and interface state at the mixed portion is increased to excessively lower the characteristic of the CCD. On the other hand, according to the electron tube 10 of the present embodiment, alkali metal introduced into the tube cannot enter the CCD 20 because of the formation of SiN film 106 at the entire uppermost surface of the CCD 20. As a result, highly sensitive electron tube can be provided without any degradation of CCD characteristic because invasion of alkali metal into the $SiO_2$ film 70 does not occur.

Further, SiN which forms SiN film 106 is known to have electrical conductivity higher than that of the $SiO_2$. Therefore, the SiN film can avoid charging at the surface of the CCD 20 due to floating free electron, etc. Consequently, highly sensitive electron tube can be provided by moderating affection to the charge transmission portion or reading portion due to the unwanted charging at the CCD surface 20 and ambient elements.

The electron tube 10 according to the present invention can provide a high gain as described above. Thus, amount of imaging signals are far greater than noise components of the CCD 20. Thus, high S/N ratio can be provided, thereby enabling image pickup of a single photon. Further, in comparison with an electron tube installing a conventional MCP (micro channel plate), open area ratio is improved, and non uniformity of a fluorescent surface can be reduced, and no conversion loss is provided at a FOP (fiber optical plate) where a fiber coupling is effected.

By the formation of the SiN film 106, any damage to the CCD 20 with alkali or acid material can be reduced during production process of the CCD 20 and invasion of alkali metal into the CCD 20 can be avoided during employment of the alkali etching liquid.

Further, the PSG film 78 formed immediately below the SiN film 106 flattens the surface of the CCD 20 thereby facilitating formation of SiN film 106 over the PSG film. The PSG film can avoid peeling of SiN film therefrom. Furthermore, the flat PSG film 78 can moderate stress which may be generated at the bonding surface due to temperature change.

While the invention has been described in detail and with reference to the specific embodiments thereof, it would be apparent to those skilled in the art that various changes and modifications may be made therein. For example, in the depicted embodiment, the SiN film 106 is formed as an uppermost layer of the CCD 20. However, instead of the SiN film, SiON film is available. Here, SiON is a material by bonding a predetermined rate of oxygen to SiN, under the condition that the resultant SiON does not transmit alkali metal therethrough, and can provide higher electrical conductivity than $SiO_2$. Also available is SiON where rate of oxygen is not uniform in the SION film, but is gradually changed spacially. Incidentally, SION belongs to silicon nitride.

Further, in the illustrated embodiment, PSG film 78 is formed below the SiN film 106. Instead of PSG, borophosphosilicate glass (BPSG), spin-on glass (SOG), and polyimide film are also available.

Furthermore, aluminum lead 86 is used as a lead wire. However, Al—Si, Al—Si—Cu and other metal having high melting point are also available as a lead wire.

INDUSTRIAL APPLIABILITY

The electron tube according to the present invention can be widely used as an image pick-up device for low illuminance region, such as a monitor camera, etc.

What is claimed is:

1. An electron tube including a vacuum container, a cathode sealed in the vacuum container and having a photocathode surface containing an alkali metal, and an anode sealed in the vacuum container and having a rear side irradiation type semiconductor device formed with a charge transmission portion, the anode having a rear surface side in confrontation with the photocathode surface; characterized in that:

the rear side irradiation type semiconductor device includes a flattened film, an electrically conductive lead, and a thin film, the flattened film covering the charge transmission portion and having a flattened top surface;

the lead being formed on the flattened film and electrically connected to the charge transmission portion; and the thin film being formed over the flattened film and the lead, and being mainly composed of a silicon nitride.

2. The electron tube as claimed in claim 1, characterized by a $SiO_2$ layer formed over the surface of the charge transmission portion, the flattened film being made from a phosphosilicate glass and formed between the $SiO_2$ layer and the thin film.

3. The electron tube as claimed in claim 1, characterized in that the charge transmission portion has a terminal portion, and a through hole is formed in the flattened film at a position above the terminal portion, the lead being electrically connected to the terminal portion through the through hole.

4. The electron tube as claimed in claim 1, characterized in that the lead has a bonding pad, and a through hole is formed in the thin film at a position above the bonding pad so as to expose the bonding pad, and an electrically conductive member is arranged in the through hole for connection to the bonding pad.

5. The electron tube as claimed in claim 2, characterized in that the charge transmission portion has a terminal portion, and a through hole is formed in the flattened film at a position above the terminal portion, the lead being electrically connected to the terminal portion through the through hole.

6. The electron tube as claimed in claim 2, characterized in that the lead has a bonding pad, and a through hole is formed in the thin film at a position above the bonding pad so as to expose the bonding pad, and an electrically conductive member is arranged in the through hole for connection to the bonding pad.

7. The electron tube as claimed in claim 3, characterized in that the lead has a bonding pad, and a through hole is formed in the thin film at a position above the bonding pad so as to expose the bonding pad, and an electrically conductive member is arranged in the through hole for connection to the bonding pad.

* * * * *